United States Patent [19]
Robb et al.

[11] Patent Number: 5,266,515
[45] Date of Patent: Nov. 30, 1993

[54] FABRICATING DUAL GATE THIN FILM TRANSISTORS

[75] Inventors: Francine Y. Robb; Stephen P. Robb, both of Tempe, Ariz.

[73] Assignee: Motorola, Inc., Schaumburg, Ill.

[21] Appl. No.: 844,077

[22] Filed: Mar. 2, 1992

[51] Int. Cl.$^5$ .................. H01L 21/265; H01L 27/00
[52] U.S. Cl. ........................... 437/56; 257/67; 257/69; 148/DIG. 126
[58] Field of Search .............. 437/56; 257/67, 69, 257/337, 338

[56] References Cited

U.S. PATENT DOCUMENTS

| | | | |
|---|---|---|---|
| 3,988,761 | 10/1976 | Kanazawa | 257/337 |
| 4,772,927 | 9/1988 | Saito et al. | 257/67 |
| 4,866,495 | 9/1989 | Kinzer | 257/337 |
| 5,124,769 | 6/1992 | Tanaka et al. | 257/69 |
| 5,144,392 | 9/1992 | Brotherton | 257/67 |

FOREIGN PATENT DOCUMENTS

| | | | |
|---|---|---|---|
| 1094355 | 5/1986 | Japan | 257/67 |
| 2073660 | 4/1987 | Japan | 257/69 |
| 2238669 | 9/1990 | Japan | 257/69 |

OTHER PUBLICATIONS

"Amorphous-Silicon thin-film metal-oxide-semiconductor Transistor" Hiroshi Hayama et al., May 1980, pp. 754–755.

"Analysis of Submicron Double-Gated Polysilicon MOS Thin Film Transistors", A. O. Adam et al., IEDM 90-3999, pp. 15.7.1–15.7.4 (1990).

*Primary Examiner*—Olik Chaudhuri
*Assistant Examiner*—Long Pham
*Attorney, Agent, or Firm*—Joe E. Barbee; Rennie William Dover

[57] ABSTRACT

A method for fabricating a dual gate thin film transistor using a power MOSFET process having a first gate area (22) made from a monocrystalline silicon. A dielectric layer (25) is formed over the monocrystalline silicon. A first gate electrode (58) contacts the first gate area (22). A thin film transistor is fabricated on a first island of polysilicon (29) over the dielectric layer (25). The thin film transistor has a second gate electrode (55), and drain and source electrodes (56, 57) wherein the drain and source electrodes (56, 57) contact different portions of the first island of polysilicon (29). Preferably, the first gate electrode (58) is coupled to the second gate electrode (55).

18 Claims, 5 Drawing Sheets

FABRICATING DUAL GATE THIN FILM TRANSISTORS

BACKGROUND OF THE INVENTION

This invention relates, in general, to thin film transistors and, more particularly, to dual gate thin film transistors manufactured with a power MOSFET process.

Typically, thin film transistors are fabricated from polysilicon which, because of the presence of grain boundaries, has a high density of trap states. A large number of trap states degrades several transistor characteristics including sub-threshold swing, threshold voltage, and drive current. In particular, the large number of trap states increases both the sub-threshold swing and the threshold voltage of the transistor, and reduces the transistor drive current.

To improve these transistor characteristics, dual gate thin film transistors have been developed. A reduction in both the sub-threshold swing and threshold voltage, as well as an increase in transistor drive current, results from incorporating an additional gate into thin film transistors. Typically, the additional gate is made from polysilicon.

One approach to manufacturing dual gate thin film transistors has been to use three layers of polysilicon wherein two of the three layers form gate regions. Unfortunately, this approach adds several processing steps to the power MOSFET process. Further, incorporating a dual gate thin film transistor having polysilicon as the additional gate into the power MOSFET process is expensive. Accordingly, it would be advantageous to have a method for manufacturing dual gate thin film transistors that is easily and inexpensively integrated into existing integrated circuit fabrication processes, especially power MOSFET processes.

SUMMARY OF THE INVENTION

Briefly stated, the present invention is a method of fabricating a dual gate thin film transistor using a power MOSFET process. A monocrystalline semiconductor material of a first conductivity type has a first region and a second region of a second conductivity type. The first region serves as a base region for a power MOSFET transistor whereas the second region serves as an isolation region for a first gate area of the dual gate thin film transistor.

A gate dielectric material is formed over a surface of the monocrystalline semiconductor material which serves as a dielectric material for a thin film transistor first gate and a power MOSFET gate. A layer of polysilicon is formed over the gate dielectric material. A plurality of openings are formed in the layer of polysilicon wherein a first opening exposes the base region of the power MOSFET transistor. An island of polysilicon housing portions of a thin film transistor is formed over the first gate area. The island of polysilicon over the first gate area has a drain region coupled to a drain electrode, a source region coupled to a source electrode, and a channel area between the source and drain regions. A first gate electrode is coupled to the first gate area.

The thin film transistor has a second gate electrode above and insulated from a portion of the island of polysilicon, over the gate area, by a gate oxide. The second gate electrode may be metal or polysilicon. Preferably, the first and second gate electrodes of the thin film transistor are coupled to each other.

DETAILED DESCRIPTION OF THE DRAWINGS

Figure 1:
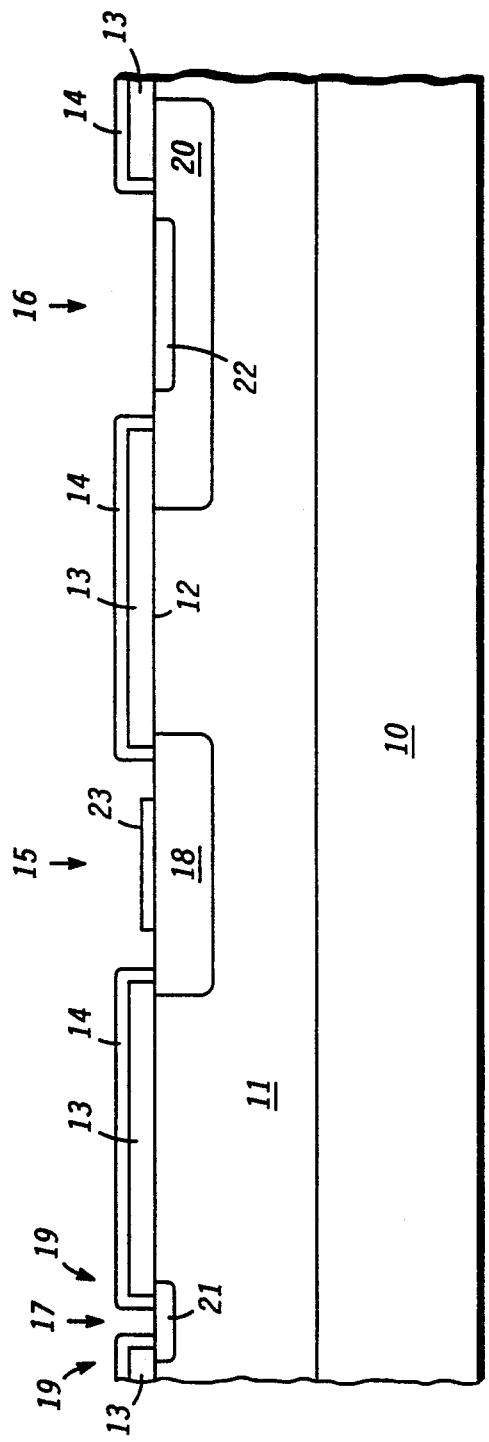
FIGS. 1-2 illustrate highly enlarged cross-sectional views of a portion of an embodiment of the present invention in progressive stages of manufacture.
Figure 2:
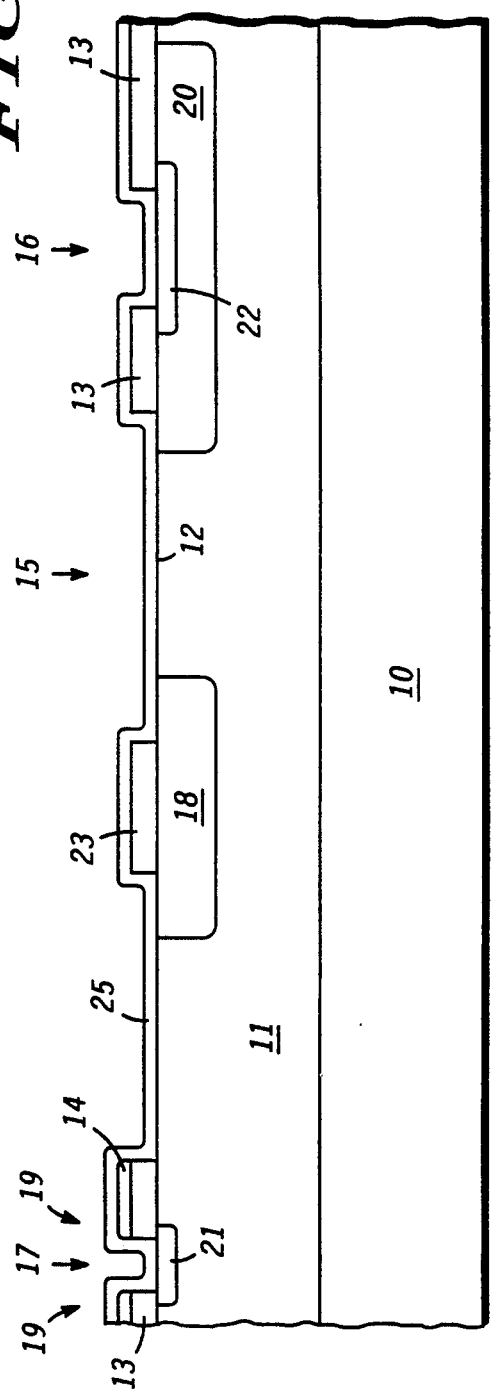

FIGS. 1-2 illustrate highly enlarged cross-sectional views of a portion of an embodiment of the present invention in progressive stages of manufacture. FIG. 1 shows a monocrystalline semiconductor substrate 10 having an epitaxial layer 11 disposed thereon. Epitaxial layer 11 and substrate 10 are a monocrystalline semiconductor material. Epitaxial layer 11 has a top surface 12 which serves as a principal surface 12. Preferably, substrate 10 and epitaxial layer 11 are of N conductivity type, wherein substrate 10 has a higher concentration of N conductivity type impurity material than epitaxial layer 11. The higher concentration region is commonly referred to as having an N+ conductivity type. For example, substrate 10 may be doped with arsenic having a concentration ranging, approximately, from $8 \times 10^{18}$ to $1 \times 10^{20}$ atoms/cm$^3$, and epitaxial layer 11 may be doped with arsenic having a concentration ranging, approximately, from $6 \times 10^{13}$ to $5 \times 10^{16}$ atoms/cm$^3$. Another suitable impurity material of N conductivity type is antimony. Although an N channel power MOSFET is described herein, it shall be understood that a P channel power MOSFET may be used. The fabrication steps for a P channel power MOSFET are obvious to those skilled in the art.

A first layer of dielectric material 13 is provided on principal surface 12. Preferably, first layer of dielectric material 13 is oxide having a thickness ranging, approximately, between 6,000 and 10,000 angstroms. First dielectric layer 13 serves as a field oxide when the dielectric material is oxide and is commonly referred to as a field or an initial oxide. It shall be understood that the type of dielectric material for first dielectric layer 13 is not a limitation of the present invention. First dielectric layer 13 is etched using means well known in the art (not shown) to provide at least three openings 15, 16, and 17 therein, extending to top or principal surface 12. The first opening 15 exposes a first portion of top surface 12, a second opening 16 exposes a second portion of top surface 12, and a third opening 17 exposes a third portion of top surface 12. The exposed first portion of top surface 12 is also referred to as a portion of a power MOSFET active area.

A first photomask layer (not shown) is formed over first dielectric layer 13 and fills first opening 15, second opening 16, and third opening 17. Preferably, the first photomask layer is photoresist. The photomask layer is patterned using means well known in the art to reopen first opening 15 and second opening 16. A first doped region 18, commonly referred to as a base region and a second doped region 20, both having conductivity type opposite to epitaxial layer 11 and extending to principal surface 12 are formed, typically, by ion implantation of a dopant through first opening 15 and second opening 16, respectively, followed by annealing and activation. Preferably, the dopant is boron having a surface concentration ranging, approximately, between $1 \times 10^{18}$ and $1 \times 10^{20}$ atoms/cm$^3$. While ion implantation is preferred for forming base region 18 and second doped region 20 other methods may also be used. Base region 18 is also referred to as a first region or a first portion, whereas second doped region 20 may also be referred to as a second region or a second portion.

Base region 18 houses at least one channel region and a source region of the power MOSFET device. Second doped region 20 serves as a junction isolation region for a first gate of the dual gate thin film transistor; consequently, second doped region 20 is commonly referred to as an isolation region 20. Isolation region 20 serves as a thin film transistor active area. It is desirable that base region 18 and isolation region 20 be shallower than epitaxial layer 11 so as not to extend into substrate 10. This provides higher breakdown and lower leakage between base region 18 and substrate 10 and between isolation region 20 and substrate 10.

The first photomask layer is removed, using means well known in the art, and a second photomask layer (not shown) is formed on first dielectric layer 13, and fills first opening 15, second opening 16, and third opening 17. The second photomask layer may be, for example, photoresist. The second photomask layer is patterned, thereby reopening third opening 17 and a center portion of second opening 16. A third doped region 21 and a fourth doped region 22 of the same conductivity type as epitaxial layer 11 and extending to principal surface 12 are formed, typically, by ion implantation of an impurity material through the openings in the second photomask layer. Preferably, the impurity material of doped regions 21 and 22 is arsenic having a concentration, approximately, between $8 \times 10^{18}$ and $1 \times 10^{20}$ atoms/cm$^3$. The third doped region 21 serves as a bias contact region for the power MOSFET transistor. Fourth doped region 22 serves as a first gate of the dual gate thin film transistor and is commonly referred to as a first gate area 22. The second photomask layer is removed.

A dielectric material 14, of for example oxide, is formed over first dielectric layer 13 and fills first opening 15, second opening 16, and third opening 17. Preferably, a thickness of dielectric material 14 is, approximately, 5,000 angstroms. A third photomask layer (not shown) is formed on dielectric material 14. The third photomask layer may be, for example, photoresist. The third photomask layer is patterned, using means well known in the art. A first section 23 of dielectric material 14 centered above first doped region 18 and a second section 19 of dielectric material 14 adjacent to third opening 17 remain covered by the third photomask layer. Uncovered portions of dielectric material 14 are etched to expose top surface 12 within first opening 15 and adjacent to the first section 23, and to expose top surface 12 within second opening 16 and third opening 17. First section 23 has a thickness of approximately 5,000 angstroms and is commonly referred to as a protective film 23.

Referring now to FIG. 2, first dielectric layer 13 is removed from principal surface 12 above first gate area 22 and from portions of principal surface 12 adjacent to protective film 23. Methods well known in the art are used to remove the portions of first dielectric layer 13. The third photomask layer is removed.

Figure 5:
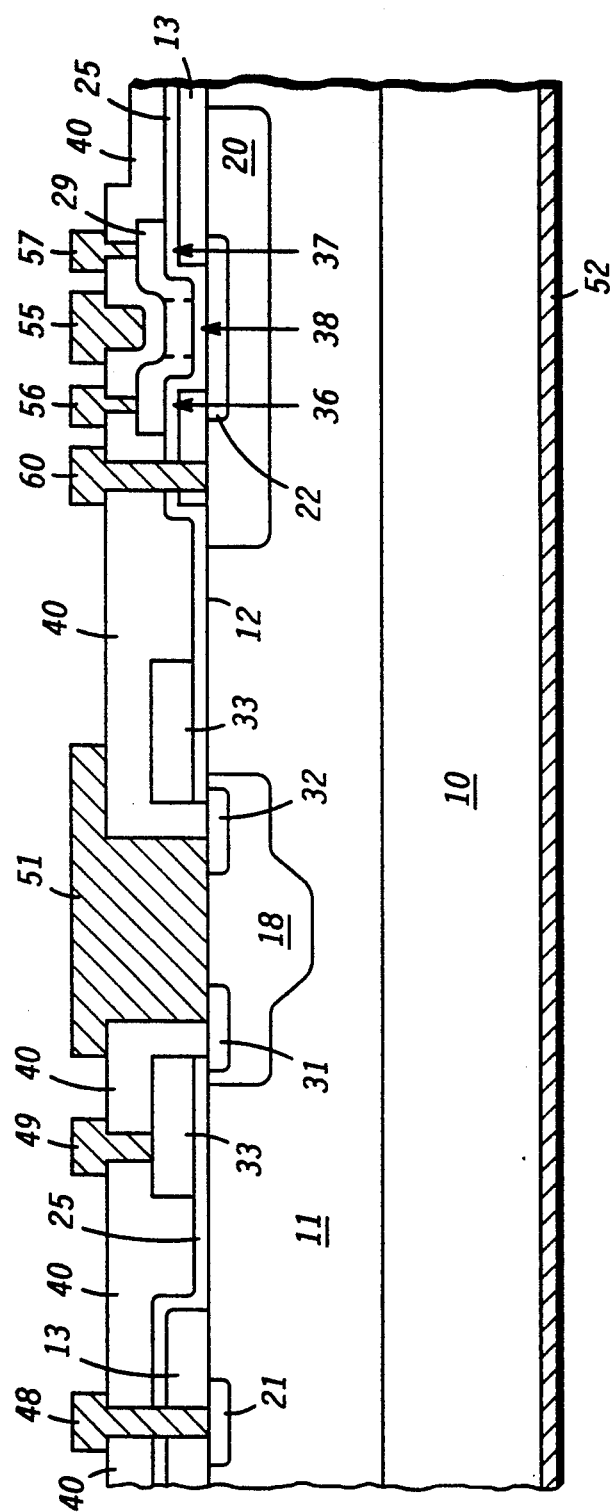
FIG. 5 illustrates a highly enlarged cross-sectional view of an embodiment of the present invention.

A second layer of dielectric material 25 covers the exposed surface structures including exposed portions of principal surface 12, first dielectric layer 13, protective film 23, and second section 19. Preferably, second layer of dielectric material 25 is oxide having a thickness ranging, approximately, between 400 and 1,100 angstroms. Second layer of dielectric material 25 serves as a first gate dielectric material of the dual gate thin film transistor and as a first gate dielectric material for the power MOSFET transistor, as illustrated in FIG. 5.

Figure 3:
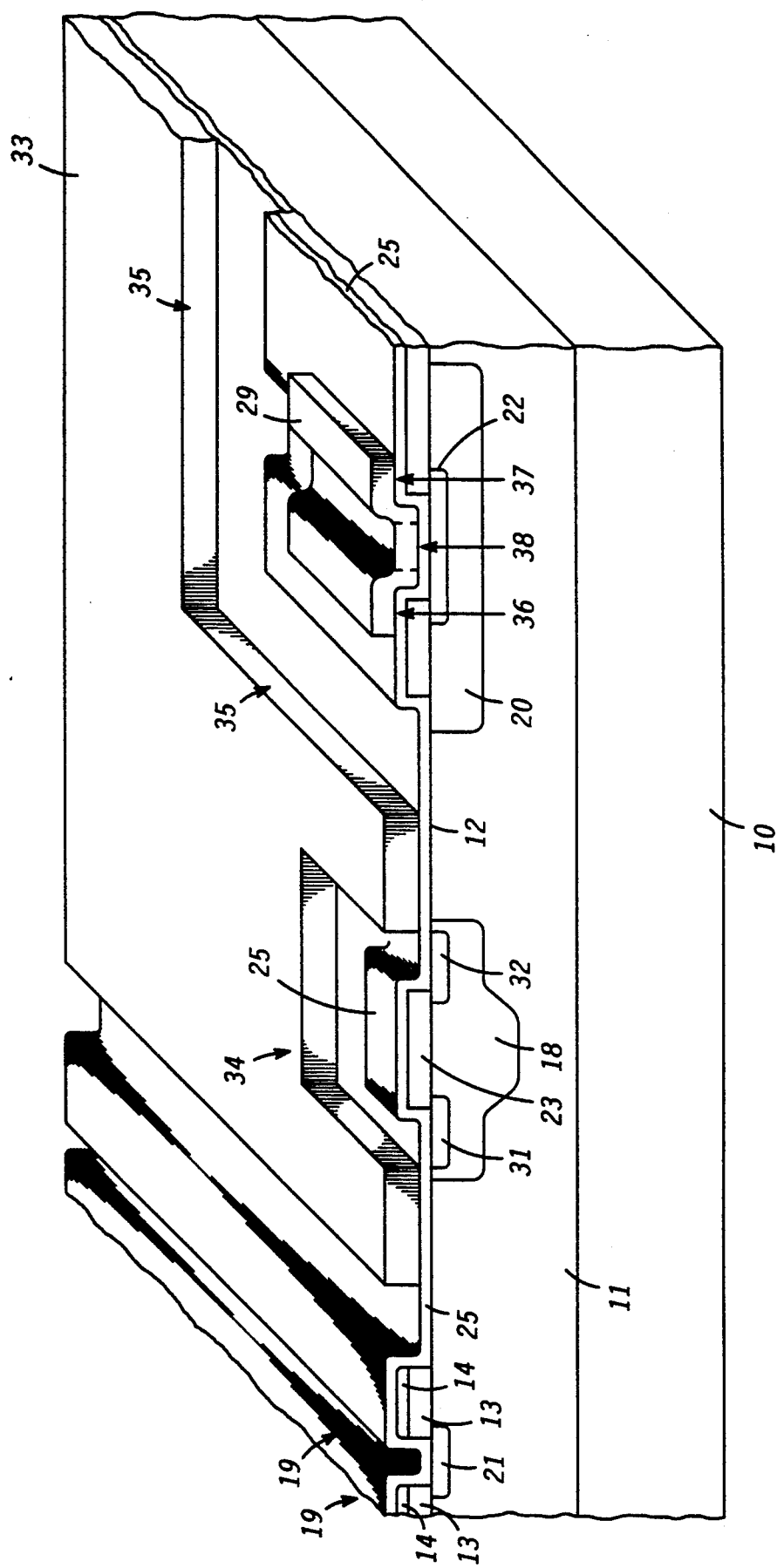
FIG. 3 illustrates a highly enlarged perspective view of a portion of an embodiment of the present invention in a stage of manufacture following the stage illustrated in FIG. 2.

Referring now to FIG. 3, a layer of polysilicon 33 is provided over second layer of dielectric material 25. Layer of polysilicon 33 is etched using means well known in the art to provide at least one opening 34 extending to second layer of dielectric material 25. Opening 34 is above and extends laterally beyond first doped region 18. Opening 34 of FIG. 3 appears to be laterally confined within first doped region 18; however, first doped region 18 is widened by a subsequent doping step. Although FIG. 3 illustrates one opening 34, it shall be understood that a plurality of openings 34 may be formed in layer of polysilicon 33 thereby providing a plurality of channel regions for the power MOSFET transistor.

A first island of polysilicon 29 is formed over first gate area 22 using means well known in the art. The first island of polysilicon 29 extends laterally past first gate area 22 but is laterally confined within second doped region 20. First island of polysilicon 29 is separated from layer of polysilicon 33 by a moat 35 extending to second layer of dielectric material 25. A remaining portion of layer of polysilicon 33 forms a power MOSFET gate.

Further, a portion of layer of polysilicon 33 above third doped region 21 is removed thereby exposing a portion of second layer of dielectric material 25. The exposed portion of second layer of dielectric material 25 extends laterally beyond third doped region 21.

Figure 4:
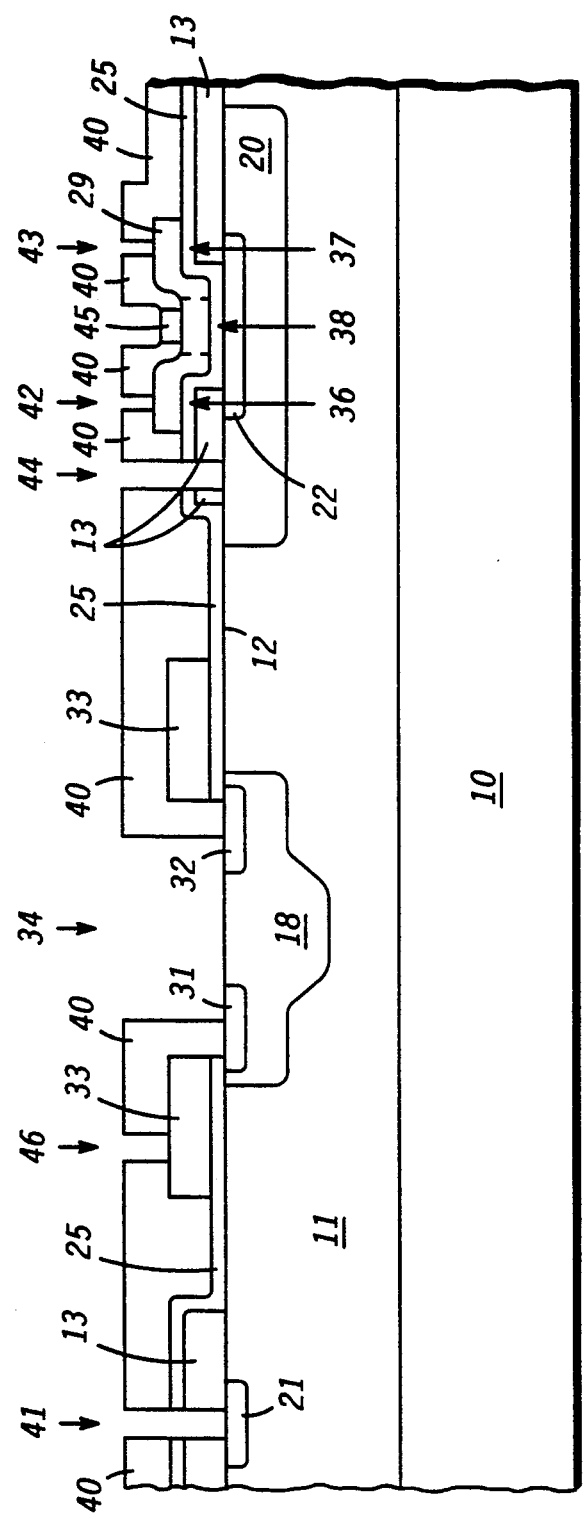
FIG. 4 illustrates a highly enlarged cross-sectional view of a portion of an embodiment of the present invention in a stage of manufacture following the stage illustrated in FIG. 3.

A fourth photomask layer (not shown), of for example photoresist, may be formed over uncovered portions of second layer of dielectric material 25, layer of polysilicon 33, first island of polysilicon 29, and protective film 23. The fourth photomask layer is patterned using means well known in the art to reopen first opening 34. An impurity material of the same conductivity type as base region 18 is introduced into epitaxial layer 11 through first opening 34. Preferably the impurity material is boron having a surface concentration of approximately $2 \times 10^{17}$ atoms/cm$^3$. This implant laterally increases the size of first dopant region 18, as indicated in FIG. 4. The fourth photomask layer is removed. It shall be understood that the fourth photomask layer is desirable but not essential. A fifth photomask layer (not shown), preferably of for example photoresist, is formed on the uncovered portions of second dielectric material 25, layer of polysilicon 33, first island of polysilicon 29, and protective film 23. The fifth photomask layer is patterned, using means well known in the art, to reopen first opening 34, to expose a portion of polysilicon layer 33, and to expose a first portion 36 and a second portion 37 of the first island of polysilicon 29. An impurity material having the same conductivity type as substrate 10 is implanted through first opening 34, forming a fourth and a fifth doped region 31 and 32, respectively. For a substrate 10 having an N+ conductivity type, the impurity material forming fourth and fifth doped regions 31 and 32, respectively, is also of N+ conductivity type. Preferably the impurity material is arsenic having a concentration, approximately, between $8 \times 10^{18}$ and $1 \times 10^{20}$ atoms/cm$^3$. Further, an impurity material of a first conductivity type is implanted into first and second portions 36 and 37, respectively, of the first island of polysilicon 29. The impurity material of first conductivity type is N+ for an N channel thin film transistor embodiment and may be from the same implant that formed fourth and fifth doped regions 31 and 32, respectively. The fifth photomask layer is removed.

A sixth photomask layer (not shown) may be formed on second dielectric material 25, layer of polysilicon 33, first island of polysilicon 29, and protective film 23. Preferably, the sixth photomask layer is photoresist. The sixth photomask layer is patterned, using means well known in the art, to expose a top surface of a third portion 38 of first island of polysilicon 29. Third portion 38 is sandwiched between and contiguous with the first and second portions 36 and 37, respectively.

As is well known in the art, typical implants for enhancement and depletion mode transistors do not necessarily apply to integrated thin film transistors. For example, in an N channel enhancement mode thin film transistor embodiment, an impurity material of P— conductivity may be implanted into third portion 38 of first island of polysilicon 29. In accordance with the N channel thin film transistor embodiment, a preferred impurity material of third portion 38 is boron having a concentration between, approximately, $6 \times 10^{13}$ and $5 \times 10^{16}$ atoms/cm$^3$.

Unlike typical FET transistors, an enhancement mode thin film transistor may be formed having an impurity material of N— conductivity type, or even with no impurity material implanted into third portion 38. In addition, an N channel depletion mode thin film transistor may be formed by implanting third portion 38 with an impurity material of N— conductivity type. Moreover, the depletion mode thin film transistor may be formed wherein no implant into third portion 38 occurs. The type of thin film transistor, enhancement mode or depletion mode, is determined by the impurity concentrations in first, second, and third portions 36, 37, and 38, respectively. Those of skill in the art will understand how to vary the doping levels of first, second, and third portions 36, 37, and 38, respectively, depending on the type of thin film transistor desired.

It shall be understood that the thin film transistor of the present invention is not limited to N channel transistors. In a P channel thin film transistor embodiment, the first conductivity type is P+. The impurity material of P+ conductivity type is implanted into first and second portions 36 and 37, respectively, of first island of polysilicon 29. Preferably, the P+ impurity material is boron having a concentration, approximately, between $8 \times 10^{18}$ and $1 \times 10^{20}$ atoms/cm$^3$.

Like the N channel thin film transistor, an enhancement mode P channel thin film transistor may be formed by introducing an impurity material of N— conductivity type, P— conductivity type, or no implant into third portion 38. For example, a P channel enhancement mode thin film transistor may be formed by implanting an impurity material of N— conductivity type into third portion 38. The impurity material may be, for example, arsenic having a concentration ranging between approximately, $6 \times 10^{13}$ and $5 \times 10^{16}$ atoms/cm$^3$. As with the N channel thin film transistor, the type of thin film transistor is a function of the impurity concentrations in first, second, and third portions 36, 37, and 38, respectively.

Referring now to FIG. 4, a third layer of dielectric material 40 is formed over exposed portions of second layer of dielectric material 25, layer of polysilicon 33, first island of polysilicon 29, protective film 23, and in opening 34. A seventh photomask layer (not shown) is formed over the third layer of dielectric material 40. Preferably, the seventh photomask layer is photoresist. The seventh photomask layer and underlying dielectric material 40 are patterned and etched, respectively, using means well known in the art to expose a portion of first island of polysilicon 29, wherein the portion is above first gate area 22, and laterally confined by first dielectric layer 13. The seventh photomask layer is removed.

Using means well known in the art, a fourth layer of dielectric material 45 is formed on the exposed portion of first island of polysilicon 29 and layer of dielectric material 40. Fourth layer of dielectric material 45 covers at least a top surface of the third portion and sections of the first and the second portions of island of polysilicon 29. Preferably, fourth layer of dielectric material 45 has a thickness between, approximately, 400 and 1,100 angstroms. Fourth layer of dielectric material 45 serves as a second gate dielectric also referred to as a gate oxide for a second gate electrode wherein the second gate electrode is a top gate electrode.

An eighth photomask layer (not shown) is formed over the third layer of dielectric material 40 and fourth layer of dielectric material 45. The eighth photomask layer is patterned, using means well known in the art, to form a plurality of openings which expose a plurality of portions of third layer of dielectric material 40. The exposed portions of dielectric material 40, along with any underlying dielectric material are removed, using means well known in the art, to expose portions of top surface 12, portions of layer of polysilicon 33, and island of polysilicon 29. The eighth photomask layer is removed and electrical contacts are formed on portions of top surface 12, at least one portion of layer of polysilicon 33, and portions of island of polysilicon 29. It shall be understood that using photoresist for the first, second, third, fourth, fifth, sixth, seventh, and eighth photomask layers is not a limitation of the present invention. The formation of the electrical contacts is expanded upon in the following paragraphs.

A bias contact opening 41 is formed by etching dielectric materials 45, 40, and 25 above third doped region 21 wherein the etching exposes principal surface 12 of third doped region 21. A power MOSFET gate contact opening 46 is formed by etching dielectric materials 45 and 40 above a portion of layer of polysilicon 33 thereby exposing a top surface of layer of polysilicon 33. A power MOSFET source contact opening 39 is formed by etching dielectric materials 45 and 40 above a portion of base region 18 thereby exposing principal surface 12 of base region 18.

A dual gate thin film transistor ground contact opening 44 is formed by etching dielectric materials 45, 40, 25, and 13 above a portion of isolation region 20, thereby exposing the portion of isolation region 20. A dual gate thin film transistor drain contact opening 42 is formed by etching dielectric materials 45 and 40 above a section of first portion 36, thereby exposing the section of first portion 36. A dual gate thin film transistor source contact opening 43 is formed by etching dielectric materials 45 and 40 above a section of second portion 37, thereby exposing the section of second portion 37. Those of skill in the art will understand how to etch portions of first, second, third, and fourth layers of dielectric material 13, 25, 40, and 45, respectively. For example, in an oxide embodiment for first, second, third, and fourth layers of dielectric material 13, 25, 40, and 45 respectively, a suitable method of performing the etching steps is to expose the desired areas to be etched to an oxide specific etchant such as hydrofluoric acid.

Referring now to FIG. 5 and using means well known in the art, a bias electrode 48 contacts principal surface 12 of third doped region 21. It shall be understood that bias electrode 48 is desirable but not essential. A power MOSFET gate electrode 49 contacts the exposed top surface of layer of polysilicon 33 through opening 46 of FIG. 4. A power MOSFET source electrode 51 contacts the exposed portion of principal surface 12 through opening 39 of FIG. 4. A power MOSFET drain electrode 52 contacts a backside surface or drain region of substrate 10. Power MOSFET gate electrode 49, source electrode 51, and drain electrode 52 may be, for example, aluminum.

In addition, a thin film transistor drain electrode 56 contacts the exposed section of first portion 36. A source electrode 57 contacts the exposed section of second portion 37. A grounding electrode or second bias electrode 60 contacts the exposed first portion of isolation region 20. It shall be understood that grounding electrode 60 is desirable but not essential. A dual gate thin film transistor second gate electrode 55 contacts a top surface of second layer of dielectric material 25 above third portion 38 of first island of polysilicon 29.

Figure 6:
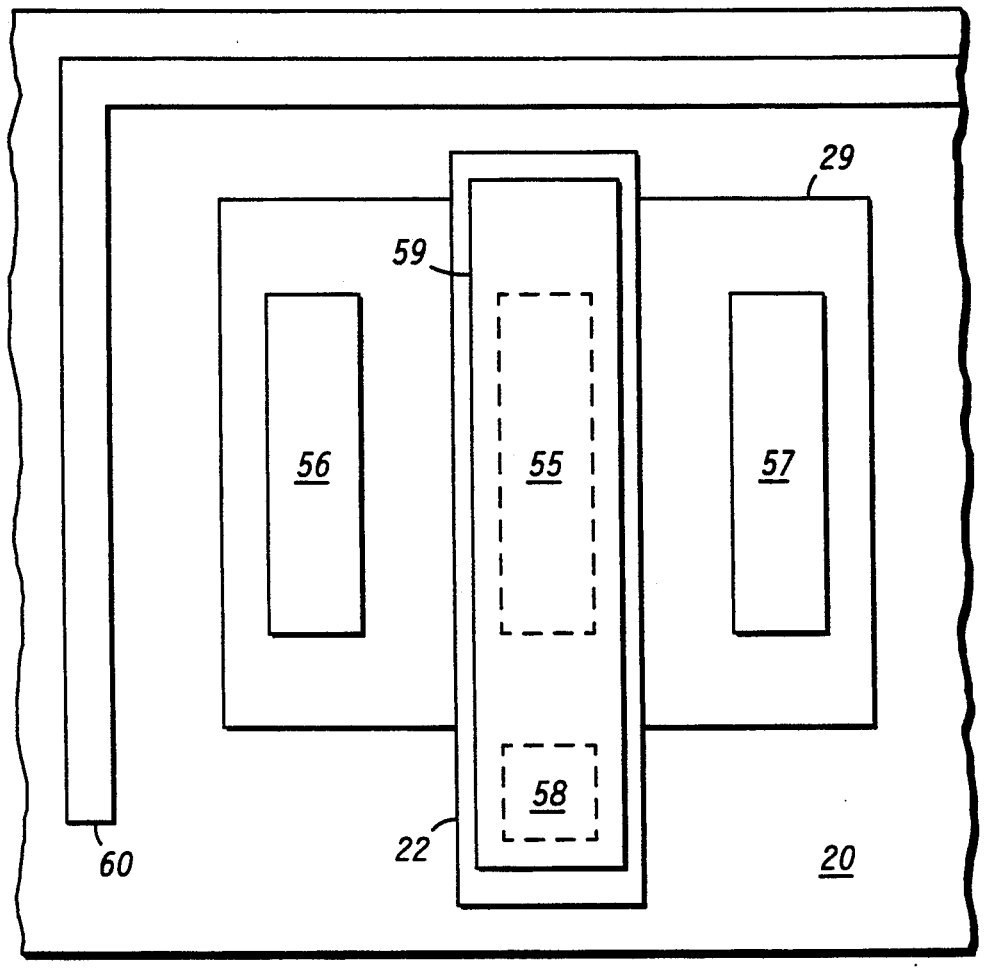
FIG. 6 illustrates a top view of an embodiment of the dual gate thin film transistor portion of the present invention.

FIG. 6 illustrates a top view of an embodiment of the dual gate thin film transistor portion of the present invention. Isolation region 20 houses first gate area 22. Grounding electrode 60 contacts isolation region 20. Island of polysilicon 29 is above a portion of second doped region 20 and a portion of first gate area 22. Second gate electrode 55 is formed between source electrode 57 and drain electrode 56. A first gate electrode 58 contacts first gate area 22. Preferably, first gate electrode 58 is coupled to second gate electrode 55 by a conductive interconnect 59. First gate electrode 58, second gate electrode 55, source electrode 57, drain electrode 56, and conductive interconnect 59 may be, for example, aluminum. Those of skill in the art will understand that the drain and source electrodes 56 and 57, respectively are interchangeable for the dual gate thin film transistor.

By now it should be appreciated that there has been provided a method for manufacturing dual gate thin film transistors. In particular, the method is incorporated into a standard power MOSFET process wherein a power MOSFET and a dual gate thin film transistor are formed using the same semiconductor material. In fact, the addition of the dual gate thin film transistor to the power MOSFET process essentially adds only a single implant step to the standard power MOSFET process. Moreover, the monocrystalline epitaxial layer serves as one of the gates of the dual gate thin film transistor; thereby reducing the cost and complexity of forming a dual gate thin film transistor relative to traditional approaches of forming dual gate thin film transistors.

What is claimed is:

1. A method for fabricating a thin film transistor in conjunction with a power MOSFET transistor, wherein the thin film transistor is a dual gate thin film transistor capable of driving the power MOSFET transistor, which comprises the steps of:

providing a semiconductor substrate of N+ conductivity type having an epitaxial layer of N conductivity type disposed thereon, the epitaxial layer having a top surface;

covering the top surface of the epitaxial layer with a first layer of dielectric material;

forming at least three openings in the first layer of dielectric material wherein a first opening exposes a first portion of the top surface of the epitaxial layer, a second opening exposes a second portion of the top surface of the epitaxial layer, and a third opening exposes a third portion of the top surface of the epitaxial layer;

forming a first doped region of P conductivity type in the epitaxial layer through the first opening and a second doped region of P conductivity type in the epitaxial layer through the second opening, wherein the first doped region and the second doped region extend to the surface;

forming a third doped region of N conductivity type in the epitaxial layer through the third opening, the third doped region extending to the surface;

providing a region of N conductivity type within the second doped region of P conductivity type, the region extending to the surface;

providing a dielectric material in a portion of at least the first opening wherein a section of the dielectric material in the portion of the at least the first opening serves as a protective film;

removing a portion of the first layer of dielectric material from the top surface of the epitaxial layer of a power MOSFET active area and a dual gate thin film transistor active area, wherein the first layer of dielectric material remains in a region surrounding the third opening;

forming a second layer of dielectric material on the top surface of the epitaxial layer wherein the second layer of dielectric material has a top surface;

providing a layer of polysilicon having at least one opening extending to the first doped region;

forming an island of polysilicon above a portion of the second doped region;

providing an impurity material of P conductivity type into the at least one opening;

providing a fourth doped region and a fifth doped region of N conductivity type within the first doped region of P conductivity type extending to the surface of the epitaxial layer;

providing an impurity material of a first conductivity type in a first portion and a second portion of the island of polysilicon wherein the island of polysilicon has a third portion which is sandwiched between and contiguous with the first portion and the second portion;

the protective film from the portion of the at least the first opening;

removing providing a third layer of dielectric material on the exposed portions of the second layer of dielectric material, the layer of polysilicon, the first island of polysilicon, and in the at least one opening;

providing a fourth layer of dielectric material wherein the fourth layer of dielectric material covers the top surface of the third portion and sections of the first and the second portions of the island of polysilicon;

providing a bias electrode, wherein the bias electrode contacts the third doped region;

providing a power MOSFET gate electrode wherein the power MOSFET gate electrode contacts the layer of polysilicon;

providing a power MOSFET source electrode wherein the source electrode contacts the epitaxial layer having the fourth and fifth doped regions and the top surface of the epitaxial layer therebetween;

providing a drain electrode on a backside surface of the semiconductor substrate of N conductivity type;

providing a first gate electrode for the thin film transistor wherein the first gate electrode contacts the second doped region;

providing a second gate electrode on the fourth layer of dielectric material which is above the third portion of the first island of polysilicon;

providing a source electrode to the thin film transistor; and providing a drain electrode to the thin film transistor.

2. The method for fabricating the thin film transistor in conjunction with a power MOSFET transistor of claim 1 further including the step of providing a grounding electrode to the second doped region of P conductivity type.

3. The method for fabricating the thin film transistor in conjunction with a power MOSFET transistor of claim 1 further including the step of providing N+ conductivity type as the first conductivity type.

4. The method for fabricating the thin film transistor in conjunction with a power MOSFET transistor of claim 3 including the step of providing the third portion of the first island of polysilicon as N− conductivity type.

5. The method for fabricating the thin film transistor in conjunction with a power MOSFET transistor of claim 3 further including the step of providing the third portion of the first island of polysilicon as P− conductivity type.

6. The method for fabricating the thin film transistor in conjunction with a power MOSFET transistor of claim 1 further including the step of providing the P+ conductivity type as the first conductivity type.

7. The method for fabricating the thin film transistor in conjunction with a power MOSFET transistor of claim 6 further including the step of providing the third portion of the first island of polysilicon as P− conductivity type.

8. The method for fabricating the thin film transistor in conjunction with a power MOSFET transistor of claim 6 further including the step of providing the third portion of the first island of polysilicon as N− conductivity type.

9. A method for manufacturing a power MOSFET transistor having an integrated thin film transistor, which comprises the steps of:

providing a monocrystalline semiconductor material of a first conductivity type having a power MOSFET active area and a thin film transistor active area wherein the power MOSFET active area comprises a first region of a second conductivity type, the first region extending to a surface of the semiconductor material, the thin film transistor active area comprises a second region of the second conductivity type, the second region extending to forming a region of the first conductivity type the surface of the semiconductor material; within the thin film transistor active area extending to the surface of the semiconductor material;

providing a layer of dielectric material on the surface of the semiconductor material housing the power MOSFET active area and on the surface of the semiconductor material housing the thin film transistor active area;

providing a layer of polysilicon over the layer of dielectric material;

forming at least one opening in the layer of polysilicon over a portion of the first region of impurity material;

providing at least one region of impurity material of the second conductivity type through the at least one opening;

forming an island of polysilicon wherein the island is above the second region;

forming a thin film transistor from the island of polysilicon wherein the thin film transistor comprises a source electrode, a drain electrode, and a second gate electrode;

forming a first gate for the thin film transistor wherein the second region of the semiconductor material serves as the first gate;

providing a power MOSFET source electrode wherein the source electrode contacts the first region of impurity material through the at least one opening in the layer of polysilicon;

providing a power MOSFET gate electrode wherein the gate electrode contacts a portion of the layer of polysilicon; and providing a power MOSFET drain electrode on a back side of the semiconductor material of first conductivity type.

10. The method for manufacturing the power MOSFET transistor having the integrated thin film transistor of claim 9 further including the step of providing N+ conductivity type as a conductivity type of the first and of the second portions of the island of polysilicon and further providing N− conductivity type as the conductivity type of the third portion of the island of polysilicon.

11. The method for manufacturing the power MOSFET transistor having the integrated thin film transistor of claim 10 further including the step of providing P− conductivity type as the conductivity type for the third portion of the island of polysilicon.

12. The method for manufacturing the power MOSFET transistor having the integrated thin film transistor of claim 9 further including the step of providing P+ conductivity as the conductivity type of the first and of the second portions of the island of polysilicon and further providing P− conductivity type as the conductivity type of the third portion of the island of polysilicon.

13. The method for manufacturing the power MOSFET transistor having the integrated thin film transistor of claim 12 further including the step of providing N−
conductivity type as the conductivity type of the third
portion of the island of polysilicon.

14. The method for manufacturing the power MOS-
FET transistor having the integrated thin film transistor
of claim 9 further including the step of providing a
second bias electrode wherein the second bias electrode
contacts the second region of the second conductivity
type of the dual gate thin film transistor active area.

15. The method for manufacturing the power MOS-
FET transistor having the integrated thin film transistor
of claim 9 further including the step of providing a bias
contact region in the semiconductor material of the first
conductivity type comprising a third region of the first
conductivity type extending to the surface of the semi-
conductor material.

16. A method of fabricating a power MOSFET tran-
sistor capable of high speed switching, which com-
prises:

providing a monocrystalline semiconductor sub-
strate;

forming a power MOSFET transistor on a first por-
tion of the monocrystalline semiconductor sub-
strate wherein the monocrystalline semiconductor
substrate houses a drain region and a source region,
and a power MOSFET gate is separated from the
source region and the drain region by a first gate
dielectric;

forming a dual gate thin film transistor on a second
portion of the monocrystalline semiconductor sub-
strate wherein the second portion of the monocrys-
talline semiconductor substrate serves as a first gate
of the dual gate thin film transistor, and an island of
polysilicon houses the dual gate thin film transistor
source region and the dual gate thin film transistor
drain region; and forming a dual gate thin film transistor second gate
above the island of polysilicon wherein the second
gate is separated from the island of polysilicon by a
second gate dielectric.

17. The method of fabricating a power MOSFET
transistor of claim 16 further including forming the dual
gate thin film transistor second gate from metal.

18. The method of fabricating a power MOSFET
transistor of claim 16 further including forming the
power MOSFET gate and the dual gate thin film tran-
sistor second gate from polysilicon.

* * * * *

UNITED STATES PATENT AND TRADEMARK OFFICE
CERTIFICATE OF CORRECTION

PATENT NO. : 5,266,515
DATED : November 30, 1993
INVENTOR(S) : Francine Y. Robb et al.

It is certified that error appears in the above-indentified patent and that said Letters Patent is hereby corrected as shown below:

In column 8, line 67, claim 1, before "the" insert --removing--.

In column 9, line 1, claim 1, delete "removing".

In column 10, lines 10-11, claim 9, delete "the surface of the semiconductor material;".

Signed and Sealed this

Tenth Day of October, 1995

*Attest:*

BRUCE LEHMAN

*Attesting Officer*   Commissioner of Patents and Trademarks